United States Patent
Li et al.

(10) Patent No.: US 10,516,078 B2
(45) Date of Patent: Dec. 24, 2019

(54) MICRO LIGHT-EMITTING DIODE DISPLAY PANEL AND DISPLAY DEVICE HAVING A FIRST EMITTING DIRECTION AND A SECOND EMITTING DIRECTION

(71) Applicant: SHANGHAI TIANMA MICRO-ELECTRONICS CO., LTD., Shanghai (CN)

(72) Inventors: Hong Li, Shanghai (CN); Fei Li, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/866,369

(22) Filed: Jan. 9, 2018

(65) Prior Publication Data
US 2019/0035974 A1    Jan. 31, 2019

(30) Foreign Application Priority Data
Jul. 25, 2017    (CN) .......................... 2017 1 0613474

(51) Int. Cl.
*H01L 33/08*    (2010.01)
*H01L 27/146*    (2006.01)
(Continued)

(52) U.S. Cl.
CPC ............ *H01L 33/08* (2013.01); *C30B 29/406* (2013.01); *G09G 3/32* (2013.01); *H01L 25/0753* (2013.01);
(Continued)

(58) Field of Classification Search
CPC ....... H01L 33/08; H01L 33/60; H01L 33/405; H01L 27/153; H01L 27/156; H01L 27/3267; H01L 27/3244; H01L 33/46
See application file for complete search history.

(56) References Cited

U.S. PATENT DOCUMENTS

| | | | | |
|---|---|---|---|---|
| 8,686,447 | B2* | 4/2014 | Tomoda | H01L 33/44 257/89 |
| 2004/0227159 | A1* | 11/2004 | Nakashima | G09G 3/3225 257/202 |
| 2009/0073093 | A1* | 3/2009 | Yamazaki | G09G 3/20 345/76 |
| 2010/0051969 | A1* | 3/2010 | Ogihara | H01L 25/0753 257/88 |

(Continued)

FOREIGN PATENT DOCUMENTS

| | | |
|---|---|---|
| CN | 102655197 A | 9/2012 |
| CN | 103730484 A | 4/2014 |
| CN | 105552190 A | 5/2016 |

OTHER PUBLICATIONS

CN Office Action, Application No. 201710613474.7, dated Jun. 11, 2019.

*Primary Examiner* — Khiem D Nguyen
(74) *Attorney, Agent, or Firm* — Alston & Bird LLP

(57) ABSTRACT

The present disclosure provides a Micro LED display panel and a display device, which can realize a double-sided display in a single display panel to save cost. The Micro LED display panel includes a plurality of light-emitting elements in a matrix. Each light-emitting element includes a first electrode, a second electrode, and a semiconductor layer, which are stacked up, and the semiconductor layer is sandwiched between the first and second electrodes. The semiconductor layer includes a first semiconductor layer, an active layer, and a second semiconductor layer, which are stacked up along a direction from the first electrode to the second electrode. The light-emitting elements include a plurality of first and second light-emitting elements, the first light-emitting elements have a first emitting direction from the first electrode to the second electrode, and the second light-emitting elements have a second emitting direction from the second electrode to the first electrode.

17 Claims, 6 Drawing Sheets

(51) Int. Cl.
  *C30B 29/40* (2006.01)
  *H01L 27/12* (2006.01)
  *H01L 25/075* (2006.01)
  *H01L 27/15* (2006.01)
  *G09G 3/32* (2016.01)
  *H01L 33/40* (2010.01)
  *H01L 33/42* (2010.01)
  *H01L 33/46* (2010.01)
  *H01L 33/62* (2010.01)
  *H01L 33/44* (2010.01)

(52) U.S. Cl.
  CPC .... *H01L 27/1259* (2013.01); *H01L 27/14692* (2013.01); *H01L 27/153* (2013.01); *G09G 2300/0842* (2013.01); *H01L 33/405* (2013.01); *H01L 33/42* (2013.01); *H01L 33/44* (2013.01); *H01L 33/46* (2013.01); *H01L 33/62* (2013.01)

(56) References Cited

U.S. PATENT DOCUMENTS

| | | | | |
|---|---|---|---|---|
| 2011/0003410 | A1* | 1/2011 | Tsay | H01L 33/0079 438/27 |
| 2013/0210194 | A1* | 8/2013 | Bibl | H01L 24/83 438/107 |
| 2014/0252336 | A1* | 9/2014 | Kobayashi | G09G 3/3225 257/40 |
| 2015/0050763 | A1* | 2/2015 | Sugiyama | H01L 33/22 438/29 |
| 2015/0076456 | A1* | 3/2015 | Choi | H01L 27/3267 257/40 |
| 2015/0123101 | A1* | 5/2015 | Fujii | H01L 27/3267 257/40 |
| 2016/0005357 | A1* | 1/2016 | Cho | G09G 3/3233 345/78 |
| 2016/0268362 | A1* | 9/2016 | Shi | H01L 27/3267 |

* cited by examiner

MICRO LIGHT-EMITTING DIODE DISPLAY PANEL AND DISPLAY DEVICE HAVING A FIRST EMITTING DIRECTION AND A SECOND EMITTING DIRECTION

CROSS-REFERENCE TO RELATED APPLICATIONS

The present application claims the benefit of priority to Chinese Patent Application No. 201710613474.7, filed on Jul. 25, 2017, the content of which is incorporated herein by reference in its entirety.

TECHNICAL FIELD

The present disclosure relates to the technical field of display technologies and, particularly, to a micro light-emitting display panel and a display device.

BACKGROUND

With the development of display technologies, a micro light-emitting display (Micro-LED) technology has arisen. Micro-LED technology refers to a technology of micro-sized light-emitting diode array integrated on a substrate with a high density. A size of each micro light-emitting diode is in a range of about from 1 μm to about 10 μm. By the Micro-LED technology, a Micro-LED display panel with high resolution can be formed. Micro-LED has advantages of high luminous efficiency, low energy consumption, and high resolution. In order to adapt to application scenarios with a requirement of double-sided display, such as a service window industry, a double-sided display device is developed.

In the related art, the double-sided display device is generally realized in a way of laminating two display panels, such as two ready-made display panel are laminated back-to-back such that one display panel emits light and displays to one side, and the other display panel emits light and displays to the other side. Since it is required that two complete display panel are made separately, a cost of the double-sided display device is relatively high.

SUMMARY

In view of the above, embodiments of the present disclosure provide a micro light-emitting diode display panel and a display device, which can realize double-sided display in a single display panel, so that the cost is reduced.

In one aspect, the embodiments of the present disclosure provide a micro light-emitting diode display panel, including a plurality of light-emitting elements arranged in a matrix, the plurality of light-emitting elements each including a first electrode, a semiconductor layer, and a second electrode; the first electrode, the semiconductor layer, and the second electrode being stacked up, and the semiconductor layer being sandwiched between the first electrode and the second electrode, wherein the semiconductor layer includes a first semiconductor layer, an active layer, and a second semiconductor layer; the first semiconductor layer, the active layer, and the second semiconductor layer are sequentially stacked up along a direction from the first electrode to the second electrode; and the plurality of light-emitting elements includes a plurality of first light-emitting elements and a plurality of second light-emitting elements, the plurality of first light-emitting elements has a first emitting direction, the plurality of second light-emitting elements has a second emitting direction, the first emitting direction is the direction from the first electrode to the second electrode, and the second emitting direction is a direction from the second electrode to the first electrode.

In another aspect, the embodiments of the present disclosure provide a display device including the micro light-emitting diode display panel as above described.

In the Micro-LED display panel and the display device in the embodiments of the present disclosure, the light-emitting elements are separated into the first light-emitting elements and the second light-emitting elements, the first light-emitting elements have the first emitting direction, and the second light-emitting elements have the second emitting direction opposite to the first emitting direction, so that when the display panel is viewed from a direction opposite to the first emitting direction, a display image formed by light emitted from the first light-emitting elements can be viewed; when the display panel is viewed from a direction opposite to the second emitting direction, a display image formed by light emitted from the second light-emitting elements can be viewed. Thus, the double-sided display is realized in a single display panel, which reduces a cost of the double-sided display.

BRIEF DESCRIPTION OF DRAWINGS

In order to more clearly illustrate technical solutions of embodiments of the present disclosure, the accompanying drawings used in the embodiments will be briefly described below. Apparently, the accompanying drawings in the following description are merely some embodiments of the present disclosure, and for those of ordinary skill in the art, without having to pay creative labor, other accompanying drawings can also be obtained according to these accompanying drawings.

DESCRIPTION OF EMBODIMENTS

In order to better understand the technical solutions of the present disclosure, embodiments of the present disclosure are described in detail as below with reference to the accompanying drawings.

Apparently, described embodiments are merely a part of embodiments of the present disclosure, rather than whole embodiments. Based on the embodiments in the present disclosure, the every other embodiment obtained by those of ordinary skill in the art without creative work belongs to the protection scope of the present disclosure.

Terms in embodiments of the present invention are used in case only for the purpose to describe a specific embodiment, rather than to limit the present disclosure. Expressions "a", "said", and "the" in singular form in the embodiments and claims of the present disclosure include the plural forms thereof, unless noted otherwise.

Figure 1:
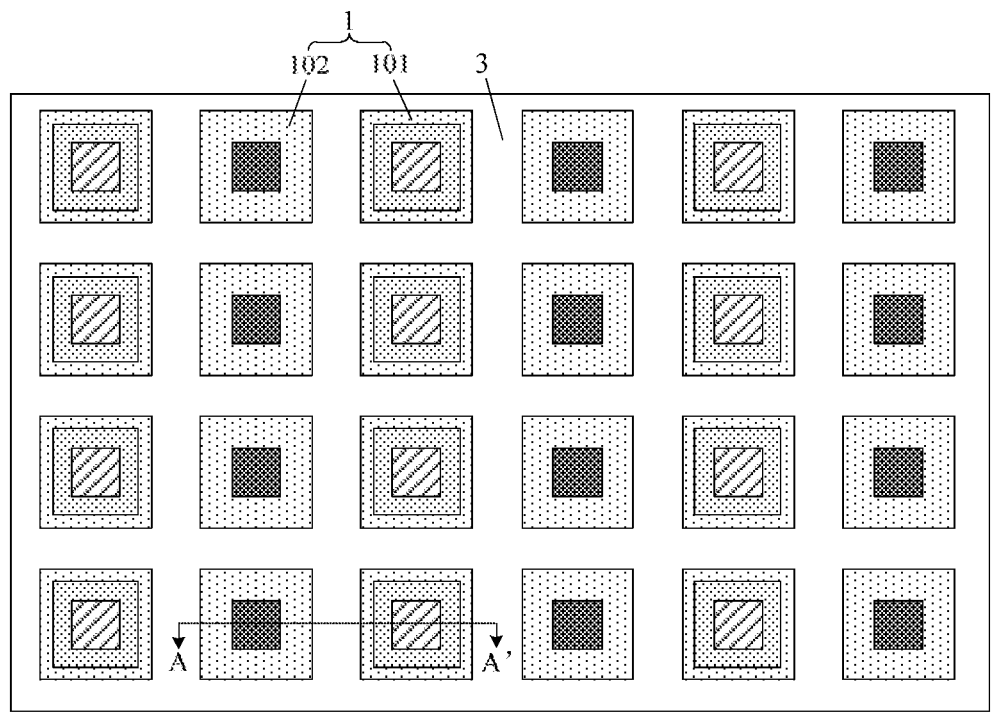
FIG. 1 is a schematic top view diagram of a micro light-emitting diode display panel in an embodiment of the present disclosure.
Figure 2:
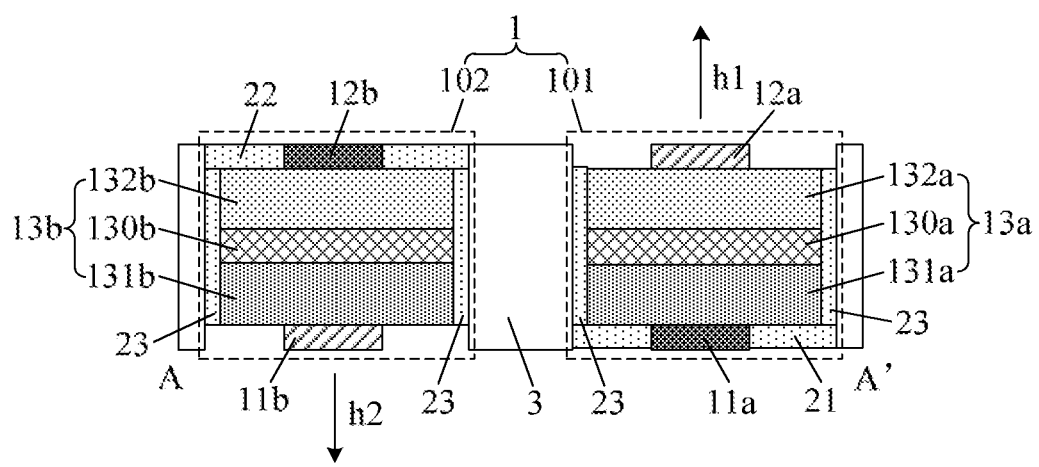
FIG. 2 is a cross-sectional view along direction AA' of FIG. 1.

FIG. 1 is a structural top view diagram of a micro light-emitting diode display panel in an embodiment of the present disclosure, and FIG. 2 is a cross-sectional view along direction AA' of FIG. 1. As shown in FIGS. 1 and 2, embodiments of the present disclosure provides a micro light-emitting diode display panel, including a plurality of light-emitting elements 1 arranged in a matrix. Each light-emitting element 1 includes a first electrode, a second electrode, and a semiconductor layer, the first electrode, the second electrode, and the semiconductor layer are stacked up, and the semiconductor layer is sandwiched between the first electrode and the second electrode. The semiconductor layer includes a first semiconductor layer, an active layer, and a second semiconductor layer, the first semiconductor layer, the active layer, and the second semiconductor layer are sequentially stacked up along a direction from the first electrode to the second electrode. The plurality of light-emitting elements 1 includes a plurality of first light-emitting elements 101 and a plurality of second light-emitting elements 102. One of the first semiconductor layer and the second semiconductor generates electrons to be injected into the active layer, and the other one of the first semiconductor layer and the second semiconductor generates holes to be injected into the active layer. The holes and electrons are combined in the active layer such that the active layer emits light. Take the first light-emitting element 101 for example, the first light-emitting element 101 includes a first electrode 11a, a second electrode 12a, and a semiconductor layer 13a, the first electrode 11a, the second electrode 12a, and the semiconductor layer 13a are stacked up, and the semiconductor layer 13a is sandwiched between the first electrode 11a and the second electrode 12a. The semiconductor layer 13a includes a first semiconductor layer 131a, an active layer 130a, and a second semiconductor layer 132a, and the first semiconductor layer 131a, the active layer 130a, and the second semiconductor layer 132a are sequentially stacked up along a direction from the first electrode 11a to the second electrode 12a. Take the second light-emitting element 102 for example, the second light-emitting element 102 includes a first electrode 11b, a second electrode 12b, and a semiconductor layer 13b, the first electrode 11b, the second electrode 12b, and the semiconductor layer 13b are stacked up, and the semiconductor layer 13b is sandwiched between the first electrode 11b and the second electrode 12b. The semiconductor layer 13b includes a first semiconductor layer 131b, an active layer 130b, and a second semiconductor layer 132b, the first semiconductor layer 131b, the active layer 130b, and the second semiconductor layer 132b are sequentially stacked up along a direction from the first electrode 11b to the second electrode 12b. The first light-emitting element 101 has a first emitting direction h1 from the first electrode 11a to the second electrode 12a, and the second light-emitting element 102 has a second emitting direction h2 from the second electrode 12b to the first electrode 11b.

The light-emitting element 1 is a Micro-LED, and a size of each light-emitting element 1 is in a range of from about 1 μm to about 10 μm. The plurality of first light-emitting elements 101 can be arranged in a matrix, and the plurality of second light-emitting elements 102 can be arranged in a matrix. The first light-emitting element 101 has the first emitting direction h1, that is to say, the first light-emitting element 101 can emit light only toward a top portion shown in FIG. 2 but not toward a bottom portion shown in FIG. 2. The second light-emitting element 102 has the second emitting direction h2, that is to say, the second light-emitting element 102 can emit light only toward the bottom portion shown in FIG. 2 but not toward the top portion shown in FIG. 2. Thus, when the display panel is viewed from the top portion shown in FIG. 2, only a display image formed by light emitted from the first light-emitting element 101 can be viewed; when the display panel is viewed from the bottom portion shown in FIG. 2, only a display image formed by light emitted from the second light-emitting element 102 can be viewed.

In the Micro-LED display panel in the embodiments of the present disclosure, the light-emitting elements are divided into the first light-emitting elements and the second light-emitting elements, the first light-emitting elements have the first emitting direction, and the second light-emitting element have the second emitting direction opposite to the first emitting direction, so that when the display panel is viewed from a direction opposite to the first emitting direction, a display image formed by light emitted from the first light-emitting element can be viewed; when the display panel is viewed from a direction opposite to the second emitting direction, a display image formed by light emitted from the second light-emitting element can be viewed. Thus, the double-sided display is realized in a single display panel, which reduces a cost of the double-sided display.

Optionally, as shown in FIG. 2, the first electrode 11a of each first light-emitting element 101 is a reflection electrode, and the second electrode 12b of each second light-emitting element 102 is a reflection electrode.

The active layer is a light-emitting layer of the light-emitting element 1 and placed between the first electrode and the second electrode. In order to adapt to the first emitting direction h1 of the first light-emitting element 101 and the second emitting direction h2 of the second light-emitting element 102, the first electrode 11a of each first light-emitting element 101 is set to be the reflection electrode, in that case, when light emitted from the active layer 130a exits to the first electrode 11a, the light can be reflected along the first emitting direction h1; and the second electrode 12b of each second light-emitting element 102 is set to be the reflection electrode, in that case, when light emitted from the active layer 130b exits to the second electrode 11b, the light can be reflected along the second emitting direction h2. Thus, luminous efficiency of the display panel in the two emitting directions can be improved.

Optionally, as shown in FIG. 2, the second electrode 12a of each first light-emitting element 101 is a transparent electrode, and the first electrode 11b of each second light-emitting element 102 is a transparent electrode.

In order to adapt to the first emitting direction h1 of the first light-emitting element 101 and the second emitting direction h2 of the second light-emitting element 102, the second electrode 12a of each first light-emitting element 101 is set to be the transparent electrode, in that case, when light emitted from the active layer 130a exits to the second electrode 12a, the light can exit through the second electrode 12a along the first emitting direction h1; and the first electrode 11b of each second light-emitting element 102 is set to be the transparent electrode, in that case, when light emitted from the active layer 130b exits to the first electrode 11b, the light can exit through the first electrode 11b along the second emitting direction h2. Thus, luminous efficiency of the display panel in the two emitting directions can be improved.

Optionally, as shown in FIG. 2, a first reflection layer 21 is placed on one side of the first semiconductor layer 131a of each first light-emitting element 101 away from the second electrode 12a of the first light-emitting element 101, and a second reflection layer 22 is placed on one side of the second semiconductor layer 132b of each second light-emitting element 102 away from the first electrode 11b of the second light-emitting element 102.

Similar to the function of the reflection electrode, in order to adapt to the first emitting direction h1 of the first light-emitting element 101 and the second emitting direction h2 of the second light-emitting element 102, the first reflection layer 21 is placed on one side of the first semiconductor layer 131a of each first light-emitting element 101 away from the second electrode 12a of the first light-emitting element 101, in that case, when light emitted from the active layer 130a exits to the first reflection layer 21a, the light can be reflected along the first emitting direction h1; and the second reflection layer 22 is placed on one side of the second semiconductor layer 132b of each second light-emitting element 102 away from the first electrode 11b of the second light-emitting element 102, in that case, when light emitted from the active layer 130b exits to the second reflection layer 22, the light can be reflected along the second emitting direction h2. Thus, luminous efficiency of the display panel in the two emitting directions can be improved.

Optionally, as shown in FIG. 2, the first reflection layer 21 and the first electrodes 11a, 11b are placed in a same layer, and the second reflection layer 22 and the second electrodes 12a, 12b are placed in a same layer.

The first reflection layer 21 and the first electrodes 11a, 11b are placed in a same layer, and the second reflection layer 22 and the second electrodes 12a, 12b are placed in a same layer. On one hand, a space use rate is improved, which is good for a thinner and lighter design of the display panel. On the other hand, since a distance between the reflection layers and the active layers 130a, 130b is reduced, light emitted from the active layers 130a, 130b can be reflected at a nearer distance, which reduces light loss and improves the luminous efficiency. It should be noted that, only a structure with the reflection layer and the electrodes in a same layer is illustrated in FIG. 2, and in other applicable implementations, the first reflection layer 21 can be placed in a different layer from the electrodes 11a, 11b, and the second reflection layer 22 can be placed in a different layer from the electrodes 12a, 12b, for example, the first reflection layer is placed on one side of the first electrode away from the second electrode, and the second reflection layer is placed on one side of the second electrode away from the first electrode.

Optionally, as shown in FIG. 2, each light-emitting element 1 further includes a third reflection layer 23, and the third reflection layer 23 surrounds sides of the semiconductor layers 13a, 13b.

In one aspect, the third reflection layer 23 surrounding the semiconductor layers 13a, 13b can reduce light emitted from sides of the light-emitting element 1 by light shading effect, so that a crosstalk between different light-emitting elements 1 can be reduced; in another aspect, the third reflection layer 23 can reflect light exiting from the sides of the light-emitting elements 1, cooperating with the reflection electrodes, the first reflection layer 21, and the second reflection layer 22, so that light in the first light-emitting elements 101 finally exits along the first emitting direction h1, and light in the second light-emitting elements 102 finally exits along the second emitting direction h2, which improves the luminous efficiency.

Optionally, as shown in FIGS. 1 and 2, the micro light-emitting diode display panel includes a pixel area and a non-pixel area 3. The plurality of light-emitting elements 1 is located in the pixel area, and a transparent material or a light proof material is placed in the non-pixel area 3.

The pixel area is an area where the light-emitting elements 1 are located, and the non-pixel area is an area outside the area where the light-emitting elements 1 are located. The transparent material can be placed in the non-pixel area, so that light at the back of the display panel can pass through the non-pixel area, and a transparent display effect is realized. Or, the light proof material can be filled in the non-pixel area to block light, which realizes a normal display and improves a contrast ratio of the display image.

Optionally, as shown in FIGS. 1 and 2, the micro light-emitting diode display panel includes a pixel area and a non-pixel area 3. The plurality of light-emitting elements 1 is located in the pixel area, and a transparent material or a light proof material is placed in the non-pixel area 3. An electrochromism thin film material is placed in the non-pixel area 3, for switching transparency and non-transparency.

The electrochromism thin film material can be materials such as tungsten trioxide or manganese trioxide. The electrochromism thin film includes a plastic or glass substrate film, two transparent conduction films plated on the substrate film, a color shift film made of metal oxide such as tungsten oxide, and an electrolyte layer. The color shift film and the electrolyte layer are sandwiched between the two transparent conduction films. When a voltage is applied to the two transparent conduction layers, the electrolyte layer is electrolyzed to generate positive ions and negative ions, and the positive ions and negative ions are transferred to the color shift film and react with the metal oxide in the color shift film to generate a color compound, so that the thin film presents a color. When a voltage with opposite polarity is applied to the two transparent conduction films, ions are transferred oppositely, and the thin film is recovered to the original state. The electrochromism thin film material can realize switch between transparency and non-transparency by controlling the electric field, that is to say, according to different application scenarios, the thin film can be switched between a transparent state and a non-transparent state. When in the transparent state, light at the back of the display panel can pass through the non-pixel area 3 to realize a transparent display effect; and when in the non-transparent state, light is blocked in the non-pixel area to realize a normal display, which improves a contrast ratio of the display image.

Figure 3:
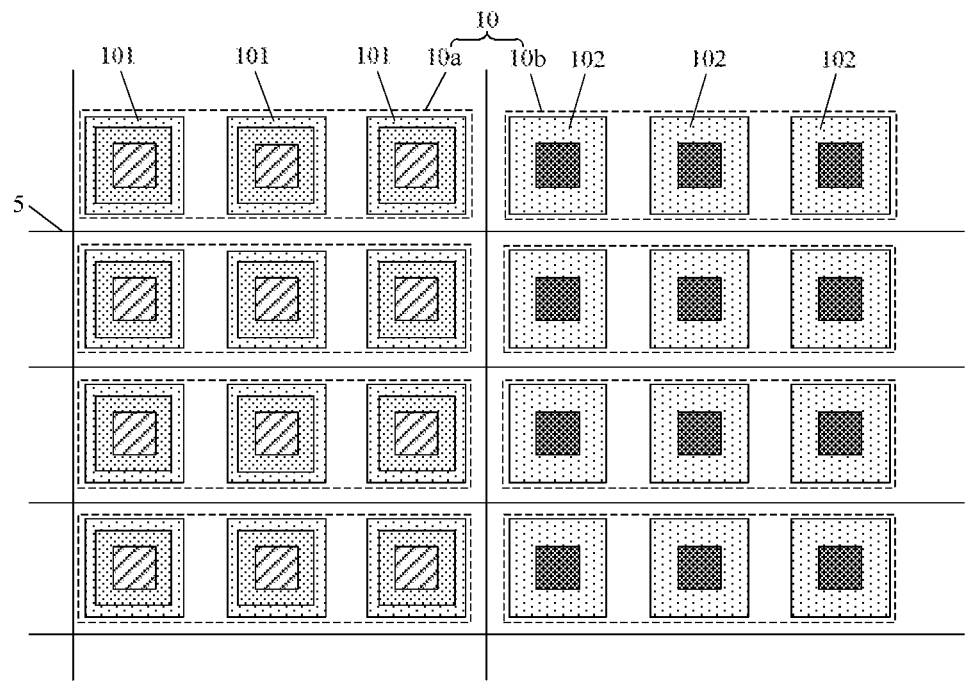
FIG. 3 is a schematic top view diagram of another micro light-emitting diode display panel in an embodiment of the present disclosure.
Figure 4:
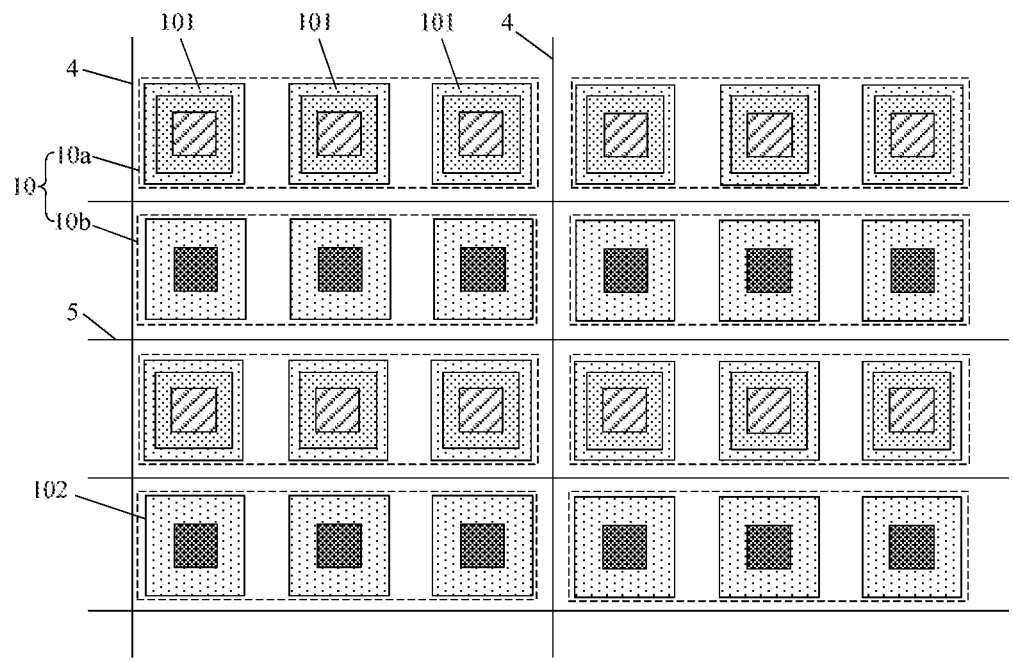
FIG. 4 is a schematic top view diagram of still another micro light-emitting diode display panel in an embodiment of the present disclosure.

FIG. 3 is a schematic top view diagram of another micro light-emitting diode display panel in an embodiment of the present disclosure; and FIG. 4 is a schematic top view diagram of still another micro light-emitting diode display panel in an embodiment of the present disclosure. Optionally, as shown in FIGS. 3 and 4, the micro light-emitting diode display panel includes a plurality of pixel units 10 arranged in a matrix. The plurality of pixel units 10 includes a plurality of first pixel units 10a arranged in a matrix and a plurality of second pixel units 10b arranged in a matrix. Each first pixel unit 10a consists of a plurality of first light-emitting elements 101, and each second pixel unit 10b consists of a plurality of second light-emitting elements 102.

For example, in each first pixel unit 10a, the first light-emitting elements 101 emit red light, green light, and blue light, respectively, to constitute a color pixel; and in each second pixel unit 10b, the second light-emitting elements 102 emit red light, green light, and blue light, respectively, to constitute a color pixel. A difference between the first pixel unit 10a and the second pixel unit 10b is that light emitting directions of the first light-emitting elements 101 and the second light-emitting elements 102 are opposite, that is to say, the plurality of first pixel units 10a arranged in a matrix is used for realizing the image display on one side of the display panel, and the plurality of second pixel units 10b arranged in a matrix is used for realizing the image display on another side of the display panel.

Optionally, as shown in FIG. 3, in a row direction, each column of the first pixel units 10a and each column of the second pixel units 10b are alternatively placed. Only one column of the first pixel units 10a and only one column of the second pixel units 10b are shown in FIG. 3.

Optionally, as shown in FIG. 4, in a column direction, each row of the first pixel units 10a and each row of the second pixel units 10b are alternatively placed. Only two rows of the first pixel units 10a and only two rows of the second pixel units 10b are shown in FIG. 4.

Optionally, as shown in FIG. 4, each column of the pixel units is associated with one data line 4.

Figure 5:
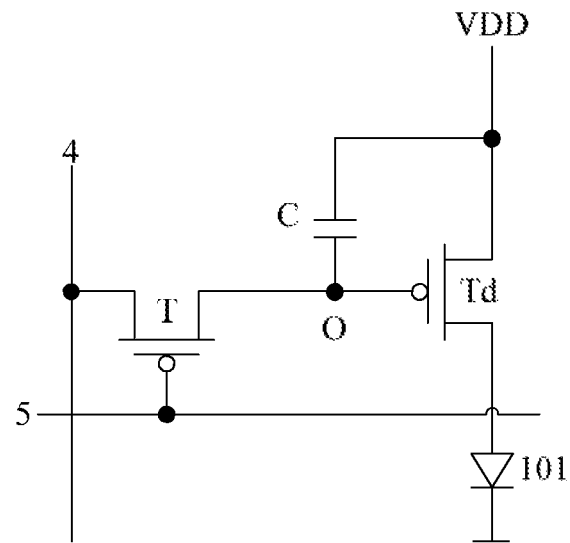
FIG. 5 is a schematic diagram of a pixel drive circuit in an embodiment of the present disclosure.
Figure 6:
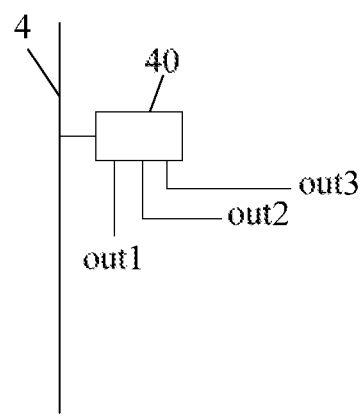
FIG. 6 is a schematic top view diagram of a connection of a demultiplexer and a data line in an embodiment of the present disclosure.

As shown in FIG. 5, which is a schematic diagram of a pixel drive circuit in an embodiment of the present disclosure, each light-emitting element 1 is associated with a pixel drive circuit. For example, the pixel drive circuit includes a drive transistor Td, a scanning transistor TR, and a storage capacitor C. A first end of the scanning transistor T is connected with a corresponding data line 4, a second end of the scanning transistor T is connected with a node O, and a control end of the scanning transistor T is connected with a corresponding gate line 5. A first end of the storage capacitor C is connected with the node O, a second end of the storage capacitor C is connected with a power source end VDD. A first end of the drive transistor Td is connected with the power source end VDD, a second end of the drive transistor Td is connected with an anode of the light-emitting element 1, and a control end of the drive transistor Td is connected with the node O. When the gate line 5 outputs a turn-on level, the scanning transistor T is turned on, a data signal on the data line 4 is transmitted to the node O, the drive transistor Td generates a drive current to drive the light-emitting element 101 to emit light. When the gate line 5 outputs a turn-off level, the scanning transistor T is turned off, the node O keeps a previous data signal voltage under a function of the storage capacitor C, and makes the drive transistor Td constantly generate a drive current. Additionally, the pixel drive circuit shown in FIG. 5 is only for example, the pixel drive circuit can be in other forms, and each pixel drive circuit can be associated with a number of gate lines rather than a single gate line. As shown in FIG. 4, one same data line 4 is associated with the first pixel unit 10a and the second pixel unit 10b, and each row of the pixel units is associated with one gate line 5. In a work process of the display panel, the first pixel unit 10a and the second pixel unit 10b share one data line 4. For example, when a first gate line 5 outputs a turn on level, the data line 4 provides data signal for the first pixel units 10a in a first row, wherein one data line 4 can provide data signal for many first light-emitting elements 101 in one first pixel unit 10a by a demultiplexer (not shown in FIG. 4). For example, as shown in FIG. 6, which is a schematic top view diagram of a connection of a demultiplexer and a data line in one embodiment of the present disclosure, the demultiplexer 40 includes an input end, a first output end out1, a second output end out2, and a third output end out3, the input end of the demultiplexer 40 is connected with the data line 4, the first output end out1 is used for connecting with the pixel drive circuit corresponding to a first one of the light-emitting elements, the second output end out2 is used for connecting with the pixel drive circuit corresponding to a second one of the light-emitting elements, and the third output end out3 is used for connecting with the pixel drive circuit corresponding to a third one of the light-emitting elements. A drive process includes three stages corresponding to three light-emitting elements respectively; at a first stage, the input end of the demultiplexer is only communicated with the first output end out1 of the demultiplexer such that the data signal on the data line 4 is transferred to the pixel drive circuit corresponding to the first one of the light-emitting elements by the demultiplexer; at a second stage, the input end of the demultiplexer is only communicated with the second output end out2 such that the data signal on the data line 4 is transferred to the pixel drive circuit corresponding to the second one of the light-emitting elements by the demultiplexer; and at a third stage, the input end of the demultiplexer is only communicated with the third output end out3 such that the data signal on the data line 4 is transferred to the pixel drive circuit corresponding to the third one of the light-emitting elements by the demultiplexer. As shown in FIG. 4, when a second one of the gate lines 5 is conducted, the data line 4 provides data signal for the second pixel units 10b in a second row; when a third one of the gate lines 5 is conducted, the data line 4 provides data signal for the second pixel units 10b in a third row, and so on, the first pixel unit 10a and the second pixel unit 10b are driven by sharing the data line 4, which saves the data line.

Figure 7:
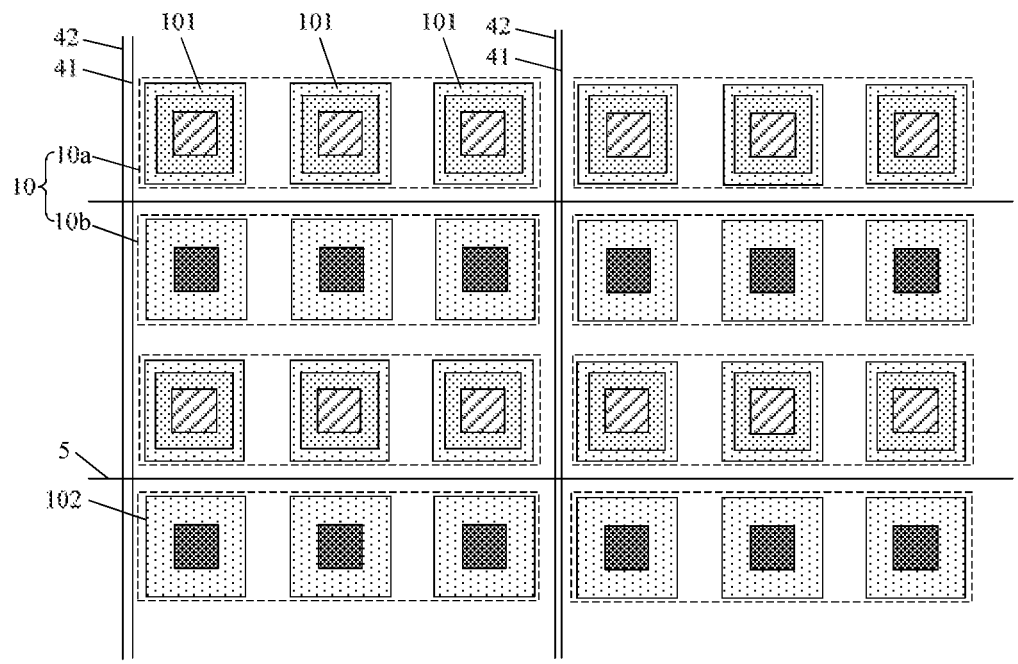
FIG. 7 is a schematic top view diagram of still another micro light-emitting diode display panel in an embodiment of the present disclosure.

Optionally, as shown in FIG. 7, which is a schematic top view diagram of still another micro light-emitting diode display panel in an embodiment of the present disclosure, each column of the pixel units 10 is associated with a first data line 41 and a second data line 42, the first data line 41 is associated with the first light-emitting elements 101, and the second data line 42 is associated with the second light-emitting elements 102.

Figure 8:
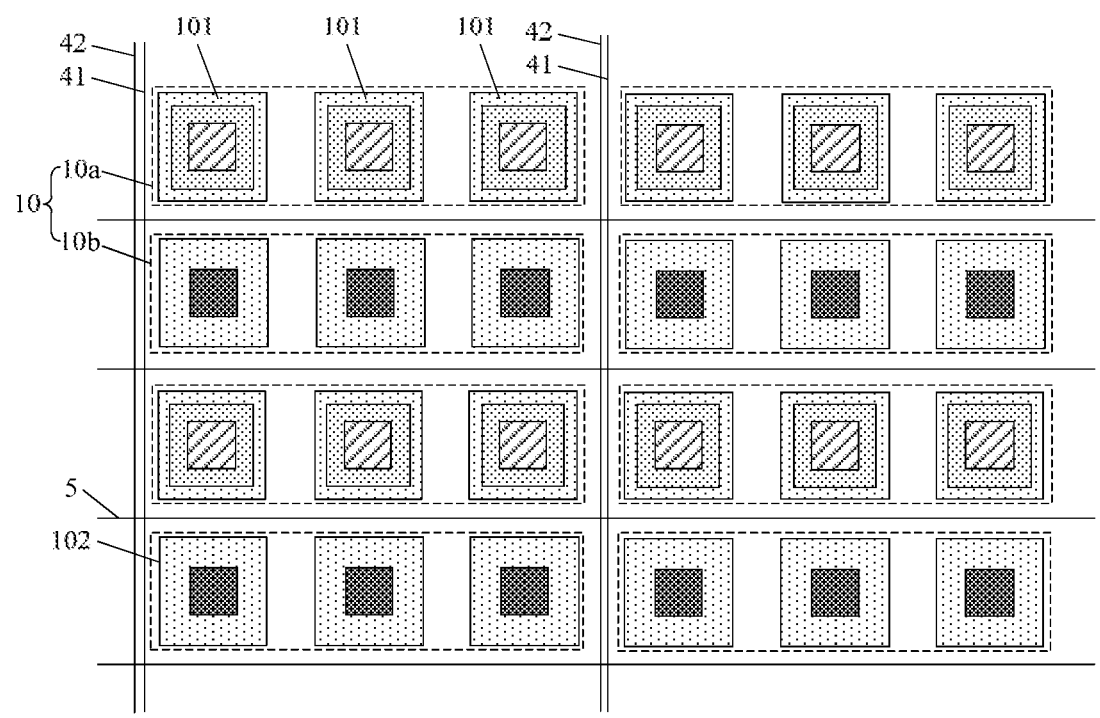
FIG. 8 is a schematic top view diagram of still another micro light-emitting diode display panel in an embodiment of the present disclosure.

Every two rows of the pixel units are associated with one gate line 5, and in a work process of the display panel, the first pixel unit 10a and the second pixel unit 10b share the gate line 5. For example, when the first one of the gate lines 5 is conducted, the first data line 41 provides the data signal for the first pixel units 10a in the first row, while the second data line 42 provides the data signal for the second pixel units 10b in the second row; when the second one of the gate lines 5 is conducted, the first data line 41 provides the data signal for the first pixel units 10a in a third row, while the second data line 42 provides the data signal for the second pixel units 10b in a fourth row; and so on. Since two rows of the pixel units can be driven simultaneously, time for driving all of the pixel units can be shortened to improve a refresh rate. In addition, the first pixel units 10a and the second pixel units 10b are driven by sharing the gate lines 5, which save the gate lines 5. In addition, as shown in FIG. 8, which is a schematic top view diagram of still another micro light-emitting diode display panel in an embodiment of the present disclosure, each row of the pixel units is associated with one gate line 5, and in a work process of the display panel, for example, when the first one and the second one of the gate lines 5 are conducted simultaneously, the first data line 41 provides the data signal for the first pixel units 10a in the first row, while the second data line 42 provides the data signal for the second pixel units 10b in the second row; when the third one and the fourth one of the gate lines 5 are conducted simultaneously, the first data line 41 provides the data signal for the first pixel units 10a in the third row, while the second data line 42 provides the data signal for the second pixel units 10b in the fourth row; and so on, all of the pixel units are driven. Compared with the structure as shown in FIG. 7, a number of the gate lines 5 is increased, while elements connected with each gate line 5 is reduced, so that load of the gate line 5 is reduced, and an adverse effect on the display caused by excessive load of the gate line 5 can be reduced.

Figure 9:
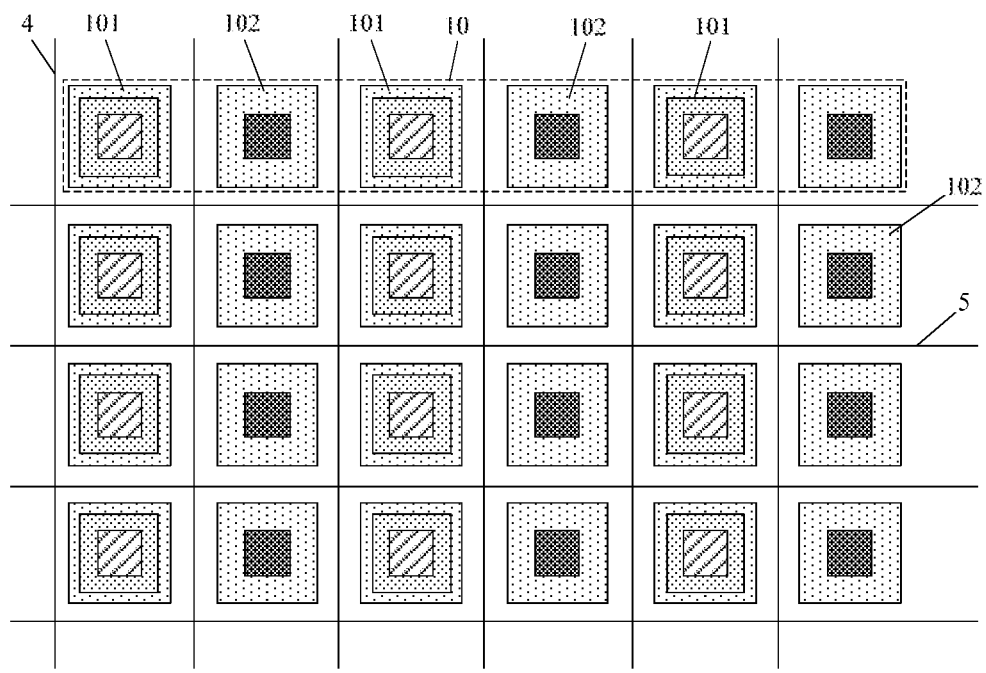
FIG. 9 is a schematic top view diagram of still another micro light-emitting diode display panel in an embodiment of the present disclosure.

Optionally, as shown in FIG. 9, which is a schematic top view diagram of still another micro light-emitting diode display panel in an embodiment of the present disclosure, the micro light-emitting diode display panel includes a plurality of pixel units 10 arranged in a matrix (only one column of the pixel units 10 are shown in FIG. 9). Each pixel unit 10 includes a plurality of first light-emitting elements 101 and a plurality of second light-emitting elements 102. In each pixel unit 10, a plurality of first light-emitting elements 101 and a plurality of second light-emitting elements 102 are arranged in a row direction.

For example, each column of the first light-emitting elements 101 and each column of the second light-emitting elements 102 are placed alternatively, which makes pixel arrangement more uniform.

Optionally, as shown in FIGS. 3, 4, and 9, each row of the pixel units is associated with one gate line 5.

For example, each column of the light-emitting elements is associated with one data line 5. For example, as shown in FIG. 9, in a work process of the display panel, for example, when a first one of the gate lines 5 is conducted, the data line 41 provides data signal for the pixel units 10 in the first row; when a second one of the gate lines 5 is conducted, the data line 4 provides the data signal for the pixel units 10 in the second row; and so on, such that all of the pixel units are driven. Since the first light-emitting element 101 and the second light-emitting element 102 can be driven simultaneously, time for scanning the whole panel is shortened, thereby providing a higher refresh rate.

Figure 10:
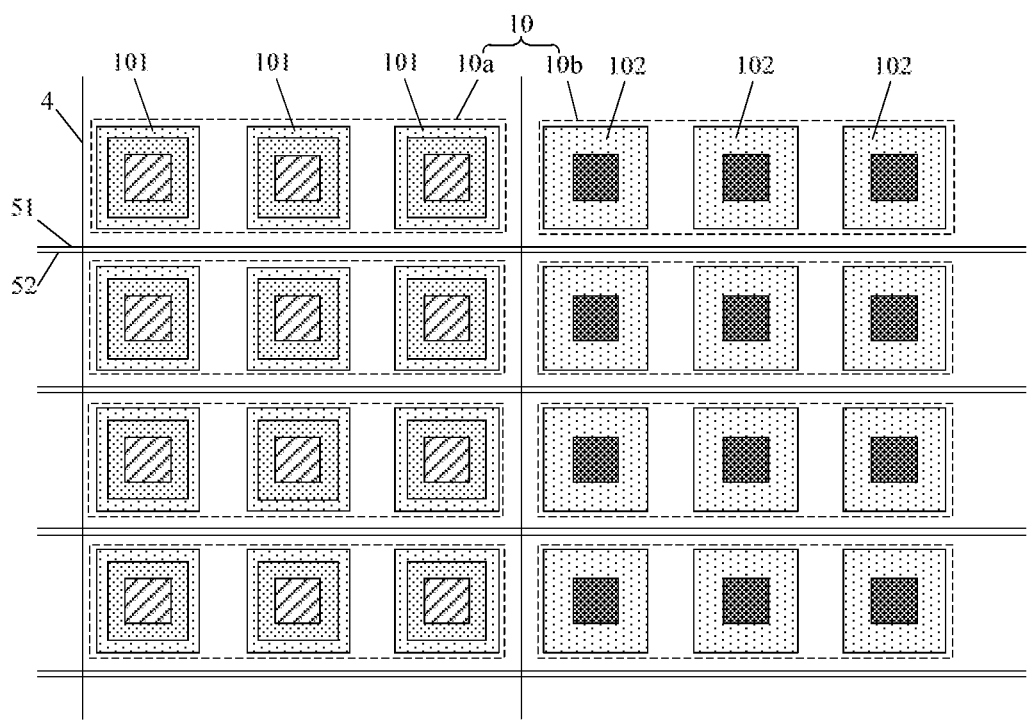
FIG. 10 is a schematic top view diagram of still another micro light-emitting diode display panel in an embodiment of the present disclosure.
Figure 11:
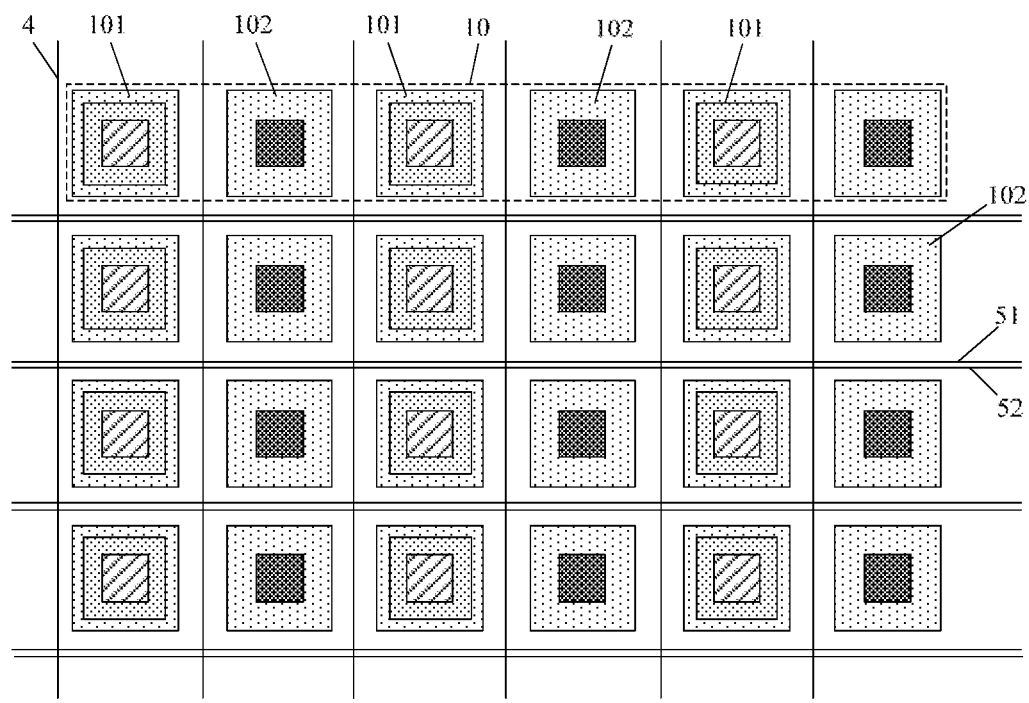
FIG. 11 is a schematic top view diagram of still another micro light-emitting diode display panel in an embodiment of the present disclosure.

FIG. 10 is a schematic top view diagram of still another micro light-emitting diode display panel in an embodiment of the present disclosure, and FIG. 11 is a schematic top view diagram of still another micro light-emitting diode display panel in an embodiment of the present disclosure. As shown in FIGS. 10 and 11, each row of the pixel units 10 is associated with a first gate line 51 and a second gate line 52, the first gate line 51 is associated with the first light-emitting elements 101, and the second gate line 52 is associated with the second light-emitting elements 102.

The first light-emitting elements 101 and the second light-emitting elements 102 are associated with different data lines 4, respectively. In a work process of the display panel, when the first and second gate lines 51, 52 corresponding to a first row of the pixel units 10 are conducted, the data line 4 provides data signal for the first light-emitting elements 101 and the second light-emitting elements 102 in the first row of the pixel units 10; when the first and second gate lines 51, 52 corresponding to a second row of the pixel units 10 are conducted, the data line 4 provides data signal for the first light-emitting elements 101 and the second light-emitting elements 102 in the second row of the pixel units 10; and so on, such that the data line 4 corresponding to the first light-emitting elements 101 provides data signal for the first light-emitting elements 101 under a control of the first gate line 51, and the data line 4 corresponding to the second light-emitting elements 102 provides data signal for the second light-emitting elements 102 under a control of the second gate line 52. Thus, each gate line is only needed to be connected with thin film transistors corresponding to a part of the light-emitting elements 1 in one row of the pixel units 10, so that load on the gate line is relatively small, which can improve display effect.

It should be noted that, in some structures shown in FIGS. 3-11, one data line 4 is associated with a plurality of columns of the light-emitting elements 1, while in some other structures, one data line 4 is associated with one column of the light-emitting elements 1. In the structures in which one data line 4 is associated with a plurality of columns of the light-emitting elements 1, the demultiplexer is not shown in figures. By the demultiplexer, one data line 4 can provide data signal for a plurality of columns of the light-emitting elements 1, which can save the data lines, but needs more time to make one data line 4 provide data signal for different columns of the light-emitting elements 1 at different stages, which may increase a drive time and is not good for improving the refresh rate. Thus, the demultiplexer can be configured according to actual requirements.

Figure 12:
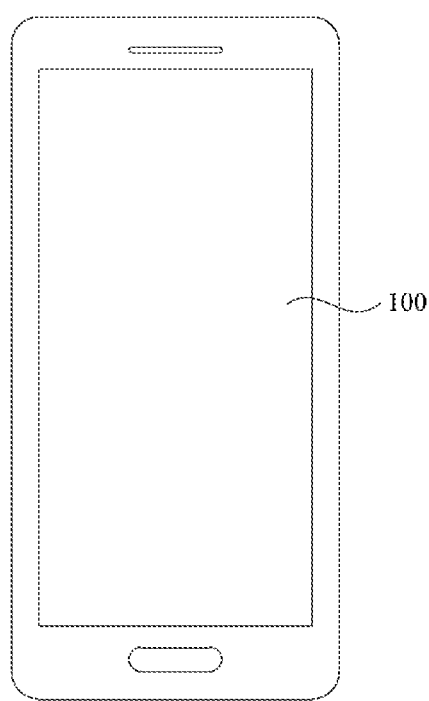
FIG. 12 is a structural schematic view of a display device in an embodiment of the present disclosure.

As shown in FIG. 12, which is a structural schematic view of a display device in an embodiment of the present disclosure, display device provided by the present embodiment of the present disclosure includes the above-described micro light-emitting diode display panel 100.

A specific structure and principle of the micro light-emitting diode display panel 100 are the same as in the above-described embodiments, which are not repeated herein. The display device can be any electronic device with a display function, such as touch display screen, mobile phone, tablet computer, notebook computer, and TV.

In the display device in the embodiments of the present disclosure, the light-emitting elements are separated into the first light-emitting elements and the second light-emitting elements, the first light-emitting elements have the first emitting direction, and the second light-emitting elements have the second emitting direction opposite to the first light-emitting element, so that when the display panel is viewed from a direction opposite to the first emitting direction, a display image formed by light emitted from the first light-emitting element can be viewed; when the display panel is viewed from a direction opposite to the second emitting direction, a display image formed by light emitted from the second light-emitting element can be viewed. Thus, the double-sided display is realized in a single display panel, which reduces a cost of the double-sided display.

The above are merely preferred embodiments of the present disclosure, which are not intended to limit the present disclosure. Within the principles of the present disclosure, any modification, equivalent substitution and improvement etc., should be included within the protection scope of the present disclosure.

What is claimed is:

1. A micro light-emitting diode display panel, comprising:
a plurality of light-emitting elements arranged in a matrix, wherein each of the plurality of light-emitting elements comprises a first electrode, a semiconductor layer, and a second electrode, wherein the first electrode, the semiconductor layer, and the second electrode are stacked up, and the semiconductor layer is sandwiched between the first electrode and the second electrode,
wherein the semiconductor layer comprises a first semiconductor layer, an active layer, and a second semiconductor layer, wherein the first semiconductor layer, the active layer, and the second semiconductor layer are sequentially stacked up along a direction from the first electrode to the second electrode;
wherein the plurality of light-emitting elements comprises a plurality of first light-emitting elements and a plurality of second light-emitting elements, wherein the plurality of first light-emitting elements has a first emitting direction, and the plurality of second light-emitting elements has a second emitting direction, wherein the first emitting direction is the direction from the first electrode to the second electrode, and the second emitting direction is a direction from the second electrode to the first electrode,
wherein each of the plurality of first light-emitting elements is provided with a first reflection layer, and the first reflection layer is placed on a side of the first semiconductor layer of the first light-emitting element away from the second electrode of the first light-emitting element; and each of the plurality of second light-emitting elements is provided with a second reflection layer,
wherein the second reflection layer is placed on a side of the second semiconductor layer of the second light-emitting element away from the first electrode of the second light-emitting element, and
wherein the first reflection layer and the first electrode are located in a same layer, and the second reflection layer and the second electrode are located in a same layer.

2. The micro light-emitting diode display panel according to claim 1, wherein the first electrode of each of the plurality of first light-emitting elements is a reflection electrode, and the second electrode of each of the plurality of second light-emitting elements is a reflection electrode.

3. The micro light-emitting diode display panel according to claim 2, wherein the second electrode of each of the plurality of first light-emitting elements is a transparent electrode, and the first electrode of each of the plurality of second light-emitting elements is a transparent electrode.

4. The micro light-emitting diode display panel according to claim 1, wherein each of the plurality of light-emitting elements further comprises a third reflection layer, wherein the third reflection layer surrounds sides of the semiconductor layer of each of the plurality of light-emitting elements.

5. The micro light-emitting diode display panel according to claim 1, further comprising a pixel area and a non-pixel area, wherein the plurality of light-emitting elements is placed in the pixel area, and a transparent material or a non-transparent material is placed in the non-pixel area.

6. The micro light-emitting diode display panel according to claim 1, further comprising a pixel area and a non-pixel area, wherein the plurality of light-emitting elements is placed in the pixel area, and an electrochromism thin film material is placed in the non-pixel area for switching between transparency and non-transparency.

7. The micro light-emitting diode display panel according to claim 1, further comprising a plurality of pixel units arranged in a matrix, wherein the plurality of pixel units comprises a plurality of first pixel units arranged in a matrix and a plurality of second pixel units arranged in a matrix, wherein each of the plurality of first pixel units consists of a plurality of first light-emitting elements, and each of the plurality of second pixel units consists of a plurality of second light-emitting elements.

8. The micro light-emitting diode display panel according to claim 7, wherein each column of the plurality of first pixel units and each column of the plurality of second pixel units are placed alternatively in a row direction.

9. The micro light-emitting diode display panel according to claim 8, wherein each row of the plurality of pixel units is associated with a first gate line and a second gate line, wherein the first gate line is associated with the first light-emitting elements in the row of the plurality of pixel units, and the second gate line is associated with the second light-emitting elements in the row of the plurality of pixel units.

10. The micro light-emitting diode display panel according to claim 7, wherein each row of the plurality of first pixel units and each row of the plurality of second pixel units are placed alternatively in a column direction.

11. The micro light-emitting diode display panel according to claim 10, wherein each column of the plurality of the first and second pixel units is associated with one data line.

12. The micro light-emitting diode display panel according to claim 10, wherein each column of the plurality of pixel units is associated with a first data line and a second data line, the first data line is associated with the first light-emitting element in the column, and the second data line is associated with the second light-emitting element in the column.

13. The micro light-emitting diode display panel according to claim 7, wherein each row of the plurality of pixel units is associated with one gate line.

14. The micro light-emitting diode display panel according to claim 1, further comprising a plurality of pixel units arranged in a matrix, wherein each of the plurality of pixel units comprises a plurality of first light-emitting elements and a plurality of second light-emitting elements, and the plurality of first light-emitting elements and the plurality of second light-emitting elements are arranged in a row direction in each of the plurality of pixel units.

15. The micro light-emitting diode display panel according to claim 14, wherein each row of the plurality of pixel units is associated with one gate line.

16. The micro light-emitting diode display panel according to claim 14, wherein each row of the plurality of pixel units is associated with a first gate line and a second gate line, wherein the first gate line is associated with the first light-emitting elements in the row of the plurality of pixel units, and the second gate line is associated with the second light-emitting elements in the row of the plurality of pixel units.

17. A display device, comprising a micro light-emitting diode display panel, wherein the micro light-emitting diode display panel comprises:
a plurality of light-emitting elements arranged in a matrix, wherein each of the plurality of light-emitting elements comprises a first electrode, a semiconductor layer, and a second electrode, wherein the first electrode, the semiconductor layer, and the second electrode are stacked up, and the semiconductor layer is sandwiched between the first electrode and the second electrode, wherein the semiconductor layer comprises a first semiconductor layer, an active layer, and a second semiconductor layer, wherein the first semiconductor layer, the active layer, and the second semiconductor layer are sequentially stacked up along a direction from the first electrode to the second electrode;

wherein the plurality of light-emitting elements comprises a plurality of first light-emitting elements and a plurality of second light-emitting elements, wherein the plurality of first light-emitting elements has a first emitting direction, and the plurality of second light-emitting elements has a second emitting direction, wherein the first emitting direction is the direction from the first electrode to the second electrode, and the second emitting direction is a direction from the second electrode to the first electrode;

wherein each of the plurality of first light-emitting elements is provided with a first reflection layer, and the first reflection layer is placed on a side of the first semiconductor layer of the first light-emitting element away from the second electrode of the first light-emitting element; and each of the plurality of second light-emitting elements is provided with a second reflection layer, and the second reflection layer is placed on a side of the second semiconductor layer of the second light-emitting element away from the first electrode of the second light-emitting element; and wherein the first reflection layer and the first electrode are located in a same layer, and the second reflection layer and the second electrode are located in a same layer.

* * * * *